United States Patent [19]
Yashiki et al.

[11] Patent Number: 6,041,465
[45] Date of Patent: Mar. 28, 2000

[54] CLEANING APPARATUS

[75] Inventors: Hiroshi Yashiki; Yuusuke Inoue, both of Ayase, Japan

[73] Assignee: Speedfam Co., Ltd., Tokyo, Japan

[21] Appl. No.: 09/178,433

[22] Filed: Oct. 23, 1998

[30]     Foreign Application Priority Data

Dec. 19, 1997 [JP] Japan .................................... 9-365029

[51] Int. Cl.$^7$ .................................................. A47L 25/00
[52] U.S. Cl. .................................. 15/88.3; 15/77; 15/102
[58] Field of Search .............................. 15/77, 102, 88.2, 15/88.3

[56]                References Cited

U.S. PATENT DOCUMENTS

| | | |
|---|---|---|
| 4,984,392 | 1/1991 | Sekigawa et al. . |
| 5,727,582 | 3/1998 | Terui . |
| 5,875,507 | 3/1999 | Stephens et al. . |
| 5,890,251 | 4/1999 | Terui . |

FOREIGN PATENT DOCUMENTS

| | | |
|---|---|---|
| 62-84971 | 4/1987 | Japan . |
| 01184831 | 7/1989 | Japan . |
| 09-069502 | 3/1997 | Japan . |

*Primary Examiner*—Terrence R. Till
*Assistant Examiner*—Jennifer McNeil
*Attorney, Agent, or Firm*—Fitch, Even, Tabin & Flannery

[57]              ABSTRACT

A cleaning apparatus enables a workpiece to be rotated at a high speed over a long period, enables the outer and inner circumferences of the workpiece to be cleaned by a simple structure without provision of a special mechanism, and enables avoidance of formation of scratches in the radial direction of the workpiece. Chuck members 1-1 to 1-3 for chucking the outer periphery of a magnetic disk W are driven to rotate by a brush rotation mechanism 4 and are made to rock back and forth in the radial direction of the magnetic disk W by a rocking portion 6 of the brush rotation mechanism 4. Specifically, the rollers 12 of the chuck members 1-1 to 1-3 are formed by polyurethane foam and a plurality of circumferential grooves 14 are formed in the surface of the rollers 12. The rod-shaped brushes 3-1 and 3-2 are formed by attaching sponges 32 having a large number of bumps 30 to the front ends of shafts 31. The rocking portion 6 makes the sponges 32 rock back and forth so that the bumps 30 at the front end swing out to the inner circumference side of the magnetic disk W and the bumps 30 at the rear end swing out to the outer circumference side of the magnetic disk W.

9 Claims, 10 Drawing Sheets

CLEANING APPARATUS

BACKGROUND OF THE INVENTION

1. Field of the Invention

The present invention relates to a cleaning apparatus for cleaning both surfaces and the circumference of a magnetic disk or other disk shaped workpiece.

2. Description of the Related Art

FIG. 16 is a plan view of an example of a cleaning apparatus of the prior art, while FIG. 17 is a sectional view along the line A—A of FIG. 16.

This cleaning apparatus is similar to the art described in Japanese Patent Laid-Open No. 62-84971. The outer periphery of a workpiece W is held by three chucks 100. The both surfaces of the workpiece W are cleaned by sponge cleaning pads 110 and 111, while the outer circumference and the inner circumference of the workpiece W are cleaned by rod-shaped brushes 120 and 121.

Specifically, as shown by the solid line in FIG. 18, each of the chucks 100 has a roller 102 rotatably attached to a shaft 101 and holds the outer periphery of the workpiece W by a groove 102a of the roller 102.

Further, the cleaning pads 110 and 111 rotate by being driven in a state gripping the both surfaces of the workpiece W, while the rod-shaped brushes 120 and 121 are rocked up and down while being rotated in a state contacting the outer circumference and the inner circumference of the workpiece W.

By this configuration, when the cleaning pads 110 and 111 are driven to rotate, the workpiece W turns along with this. The rollers 102 are driven to rotate around the shafts 101 so as to allow rotation of the workpiece W. By spraying the workpiece W with cleaning water, not shown, the both surfaces of the workpiece W are cleaned by the cleaning pads 110 and 111. On the other hand, the outer and inner circumferences of the workpiece W are cleaned by the rotation and rocking action of the rod-shaped brushes 120 and 121. All the surfaces of the workpiece W are therefore cleaned by these cleaning pads 110 and 111 and rod-shaped brushes 120 and 121.

There are the following problems with the above cleaning apparatus of the related art, however.

Since the workpiece W is turned along with the rotation of the cleaning pads 110 and 111, the rotational speed of the workpiece W is extremely low. Therefore, a long time is required until the cleaning is completed and the work efficiency is extremely poor.

Further, since the apparatus is structured to hold the outer periphery of the workpiece W by the grooves 102a of the rollers 102, as shown by the broken lines in FIG. 18, the grooves 102a become abraded in a short time and the workpiece W consequently tilts and will no longer move. As a result, it is necessary to stop the cleaning apparatus and frequently replace the rollers 102. This has been a factor lowering the operating rate of the cleaning apparatus.

Further, it was necessary to specially provide the rod-shaped brushes 120 and 121 rotated and rocked by a not shown drive mechanism so as to clean the outer and inner circumferences of the workpiece W. This invited a large size and higher costs in the apparatus.

Further, since the cleaning pads 110 and 111 rotate horizontally with respect to the plane of the workpiece W, the rotational forces of the cleaning pads 110 and 111 act not only in the circumferential direction of the workpiece W, but also the radial direction. The abrasives etc. in the polishing fluid therefore cause scratches in the radial direction of the workpiece W. That is, when the workpiece W is a magnetic disk, as shown in FIG. 19, bit areas B are continuously formed in the longitudinal direction of the track T of the width b.

If a track T is scratched in this way, bit errors will occur and the signal reproduction will be inhibited. If the width a of the scratches C in the longitudinal direction of a track T, that is, the circumferential direction of the workpiece W, is made smaller than ¼ of the track width b, however, bit errors will not occur. Therefore, scratches of a width of ¼ of the track width b can be allowed. The size of the abrasives of the polishing fluid etc. is extremely small, and the width a of the scratches caused by the abrasives etc. is smaller than ¼ of the track width b.

Therefore, there is not that much of a problem even if a scratch is formed in the circumferential direction of the workpiece W. As opposed to this, however, as shown by the broken lines, if a scratch C is formed in the radial direction of the workpiece W, it will cover the majority of the extremely small width bit area B and therefore bit error will occur. Therefore, in cleaning where scratches are formed in the radial direction of the workpiece W like with the above cleaning apparatus of the related art, bit errors frequently occur in the magnetic disk etc. after cleaning. In particular, the bit error was remarkable in cleaning of high density magnetic disks endangering their very usefulness.

Some of the cleaning apparatuses of the related art, however, such as with the cleaning apparatus of Japanese Patent Laid-Open No. 9-69502, drive one of the chucks 100 to rotate to make the workpiece W turn at a high speed and thereby improves the efficiency of the cleaning work. In such an apparatus as well, however, if the roller 102 of the chuck 100 driven to rotate abrades, the frictional coefficient of the portions of contact of the roller 102 and the workpiece W will be reduced and there is the danger of the roller 201 spinning on its own and the workpiece W no longer being turned.

SUMMARY OF THE INVENTION

The present invention was made to solve the above problems and has as its object to provide a cleaning apparatus which enables a workpiece W to be rotated at high speed for a long period of time, enables the outer and inner circumferences of the workpiece to be cleaned by a simple structure without provision of a special mechanism, and further enables the avoidance of scratches in the radial direction.

To achieve the above object, the aspect of the invention provides a cleaning apparatus comprises: at least three chuck members for chucking the periphery of a disk shaped workpiece; a chuck rotation mechanism for making at least one of the chuck members rotate; a rod shaped brush arranged in a state in contact with a surface of the workpiece so as to face a radial direction of the workpiece; and a brush rotation mechanism for making the rod shaped brush rotate about a shaft thereof; the chuck members being formed of a material having a high abrasion resistance and a high frictional coefficient and the surface of the chuck members being formed with circumferential grooves for engagement with the periphery of the workpiece.

Due to this configuration, when the chuck rotation mechanism is used to make at least one of the chuck members rotate, the workpiece engaged at its periphery with the circumferential grooves of the at least three chuck members turns. In this state, the brush rotation mechanism is used to make the rod-shaped brush rotate about a shaft thereof to enable cleaning of the surface of the workpiece.

By increasing the rotational speed of the chuck members by the chuck rotation mechanism, it is possible to make the workpiece rotate at a high speed.

At this time, since the chuck members are formed by a material having a high frictional coefficient, the rotation of the chuck members is reliably transmitted to the workpiece without the workpiece slipping in the circumferential grooves.

Further, since the chuck members have a high abrasion resistance, the amount of abrasion per unit time of the circumferential grooves of the chuck members in contact with the periphery of the workpiece is extremely small.

Further, since the rod-shaped brush contacting the surface of the workpiece facing the radial direction of the workpiece rotates about a shaft of the brush, there is no scratching in the radial direction of the workpiece.

Even a chuck member made of a material with a high abrasion resistance, however, is liable to be abraded sooner or later. Therefore, the aspect of the invention provides a cleaning apparatus, wherein a plurality of circumferential grooves are provided in longitudinal directions of the chuck members.

By this configuration, when the circumferential grooves are abraded a predetermined amount during use of the chuck member, it is possible to make the periphery of the workpiece engage with other nonabraded circumferential grooves.

To contribute to the improvement of the operating rate of the cleaning apparatus as explained above, the chuck members should be made of a material having a high abrasion resistance and high frictional coefficient. As one example, the chuck members are formed from polyurethane foam.

Further, the more the chuck members driven by the chuck rotation mechanism, the more reliably and the higher the speed the workpiece can be rotated. Therefore, the chuck rotation mechanism makes all of the chuck members rotate.

Further, the rod-shaped brush should rotate while in contact with the surface of the workpiece. As one example, the rod-shaped brush has a plurality of projections on its surface formed by an elastic material.

By this configuration, the plurality of projections of the rod-shaped brush elastically contact the surface of the workpiece while rotating and thereby reliably clean the surface of the workpiece.

Further, as another example of the rod-shaped brush, the rod-shaped brush is a flocked brush.

By this configuration as well, the flocked brush contact the surface of the workpiece while rotating and thereby reliably clean the surface of the workpiece.

The above rod-shaped brush rotates about a shaft thereof, but this does not exclude making it rock in its axial direction. Therefore, the brush rotation mechanism makes the rod-shaped brush rotate about a shaft thereof and makes the rod-shaped brush rock back and forth so that part of the rod-shaped brush swings out to at least the outer circumference side of the workpiece.

Due to this configuration, the part of the rod-shaped brush swinging out due to the rocking action of the rod-shaped brush cleans at least the outer circumference of the workpiece.

Depending on the magnitude of the rocking speed of the rod-shaped brush, however, scratches are liable to be formed in the radial direction of the surface of the workpiece. Therefore, the speed of rocking of the rod-shaped brush is set to be slower than the rotational speed of the workpiece so that the point of contact of the rod-shaped brush with respect to the workpiece draws a path in the substantially circumferential direction of the workpiece.

Due to this configuration, scratches formed in the surface of the workpiece draw a path in the circumferential direction of the workpiece.

Further, some workpieces are donut-shaped form like magnetic disks. Therefore, the workpiece is a donut-shaped disk and the brush rotation mechanism makes the rod-shaped brush rock back and forth so that a rear end of the rod-shaped brush swings out to the outer circumference side of the workpiece and so that a front end of the rod-shaped brush swings out to the inner circumference side of the workpiece.

Due to this configuration, the outer circumference of the workpiece is cleaned by the rear end of the rod-shaped brush swinging out to the outer circumference side of the donut-shaped workpiece and the inner circumference of the workpiece is cleaned by the front end of the rod-shaped brush swinging out to the inner circumference side of the workpiece.

BRIEF DESCRIPTION OF THE DRAWINGS

The above and other objects, features, and advantages of the present invention will become more readily apparent from the following description of presently preferred embodiments of the invention taken in conjunction with the accompanying drawings, in which.

DESCRIPTION OF THE PREFERRED EMBODIMENTS

Below, embodiments of the present invention will be explained with reference to the drawings.

Figure 1:
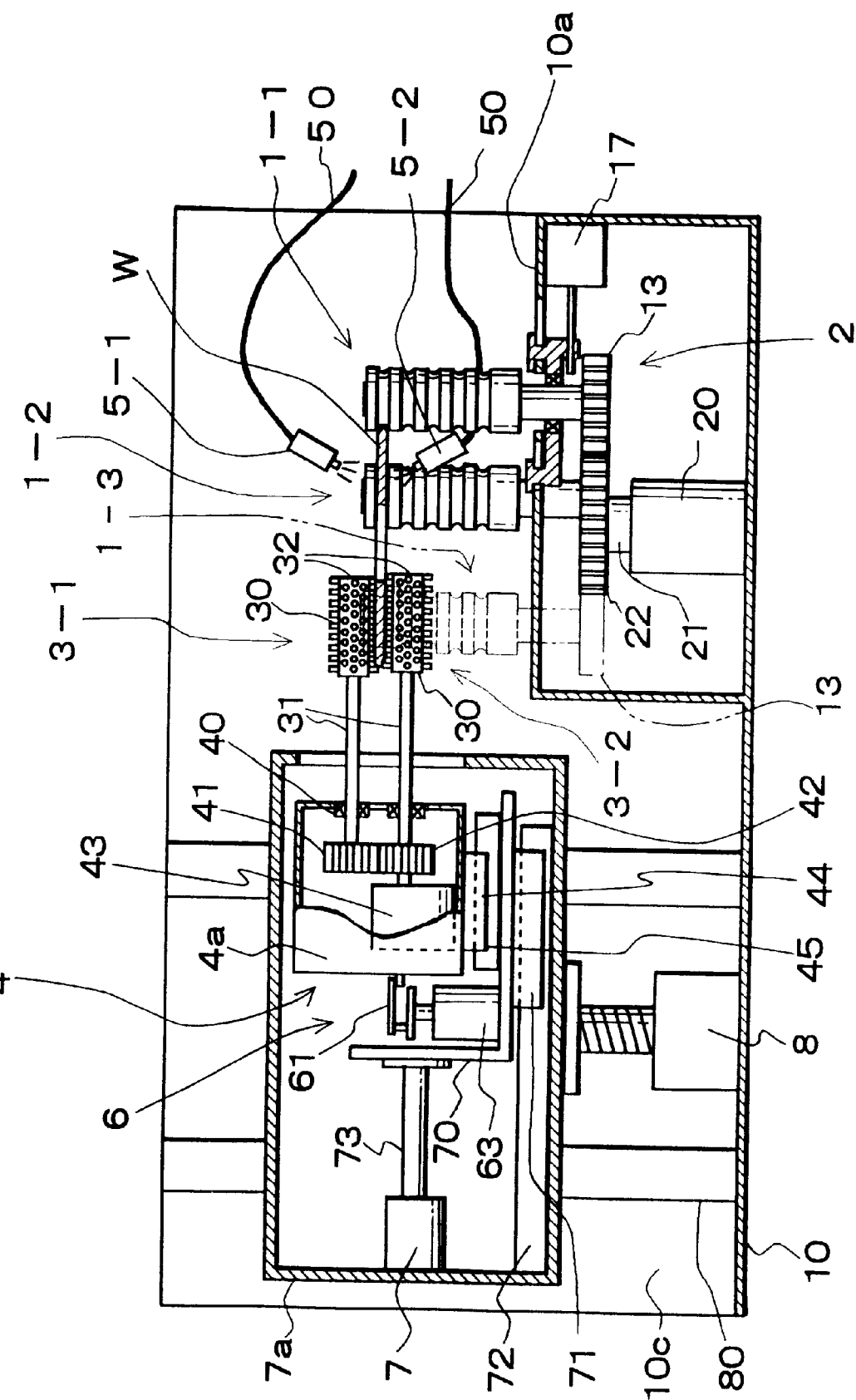
FIG. 1 is a partially cut away side view of a cleaning apparatus according to a first embodiment of the present invention.

FIG. 1 is a partially cut away side view of a cleaning apparatus according to a first embodiment of the present invention.

As shown in FIG. 1, the cleaning apparatus of this embodiment is comprised of three chuck members 1-1 to 1-3 for chucking the periphery of a donut-shaped workpiece, that is, a magnetic disk W; a chuck rotation mechanism 2 for driving the rotation of all of the chuck members 1-1 to 1-3; a pair of rod-shaped brushes 3-1 and 3-2 able to rotatable in contact with the upper and lower surfaces of the magnetic disk W; a brush rotation mechanism 4 for making the rod-shaped brushes 3-1 and 3-2 rotate about shafts thereof; and nozzles 5-1 and 5-2 for spraying pure water on the upper and lower surfaces of the magnetic disk W. These mechanisms are built into an apparatus housing 10.

Figure 2:
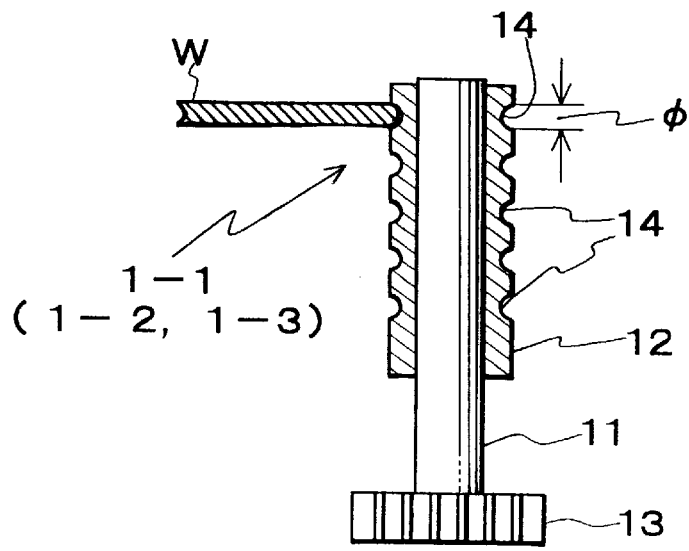
FIG. 2 is a sectional view of a chuck member.

Each of the chuck members 1-1 to 1-3, as shown in FIG. 2, is constructed with a roller 12 affixed to a stainless steel shaft 11 and with a gear 13 affixed to the lower end of the shaft 11.

The roller 12 is formed in a cylindrical shape by polyurethane foam of a hardness 40 having pliability, a high abrasion resistance, and a high frictional coefficient. The diameter of the roller 12 is set to about ⅓ of the diameter of the magnetic disk W.

Such a roller 12 is provided on its surface with five circumferential grooves 14 at predetermined intervals in the longitudinal direction of the roller 12. The circumferential grooves 14 are for engagement with the outer periphery of the magnetic disk W. The groove width $\phi$ is set to be substantially equal to the thickness of the magnetic disk W. The sectional shape of the groove is made substantially semicircular matching with the curve of the outer periphery of the magnetic disk W.

Figure 3:
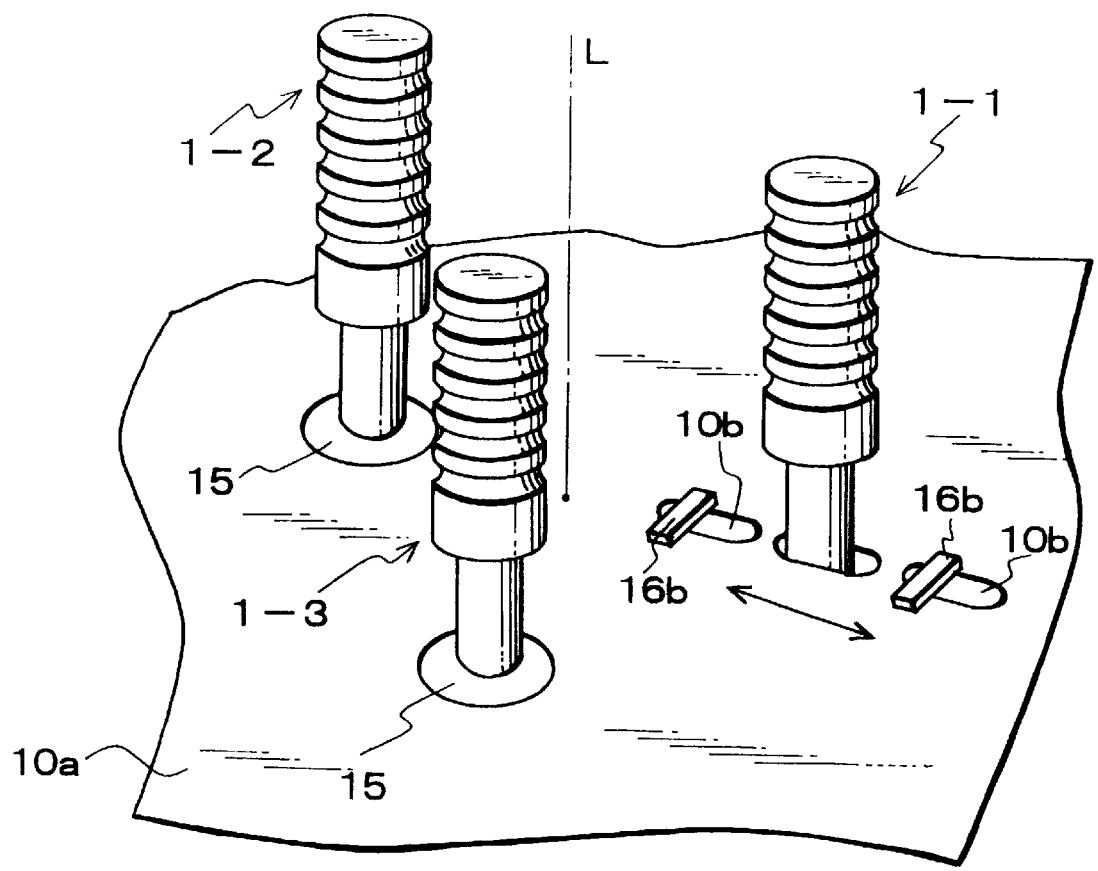
FIG. 3 is a perspective view of the state of arrangement of three chuck members.

These three chuck members 1-1 to 1-3, as shown in FIG. 3, are set on the top surface of a holding chamber 10a of the chuck rotation mechanism 2 at 120° intervals about a center axis L and are supported rotatably by bearings 15. The chuck member 1-1 however is mounted so as to enable it to be moved forward or retracted in the direction of the center axis L.

Figure 4:
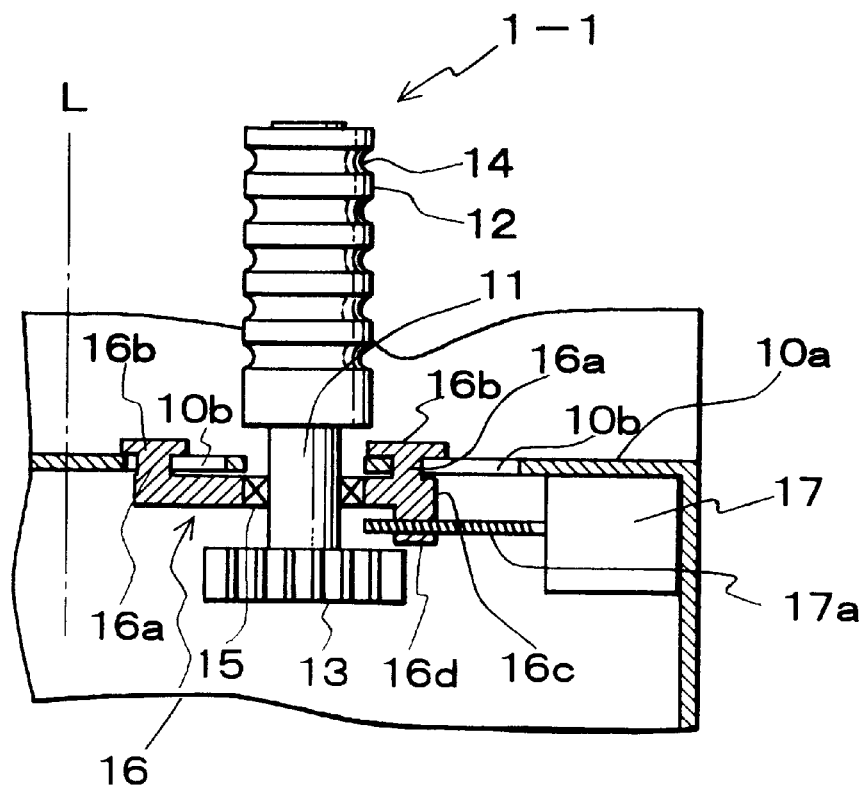
FIG. 4 is a sectional view of the mounting structure of movable chuck members.

FIG. 4 is a sectional view of the mounting structure of the chuck member 1-1.

As shown in FIG. 4, the chuck member 1-1 is set rotatably on a slider 16 arranged at the inside of the holding chamber 10a through the bearing 15.

The slider 16 has projections 16a, 16a engaging with a pair of elongated holes 10b, 10b formed toward the center axis L direction in the top surface of the holding chamber 10a. The wide portions 16b, 16b of the top ends of the projections 16a, 16a engage with the elongated holes 10b, 10b.

Further, the slider 16 is formed at its bottom surface with a projection 16d having a female screw 16c. At the inside of the holding chamber 10a, further, is affixed a motor 17 having a male screw 17a as its shaft. The male screw 17a is screwed into the female screw 16c of the slider 16.

Due to this, by making the male screw 17a rotate in the forward direction by the motor 17, the chuck member 1-1 is moved to approach the center axis L along the elongated hole 10b together with the slider 16. By making the male screw 17a rotate in the reverse direction, the chuck member 1-1 is moved away from the center axis L.

Figure 5:
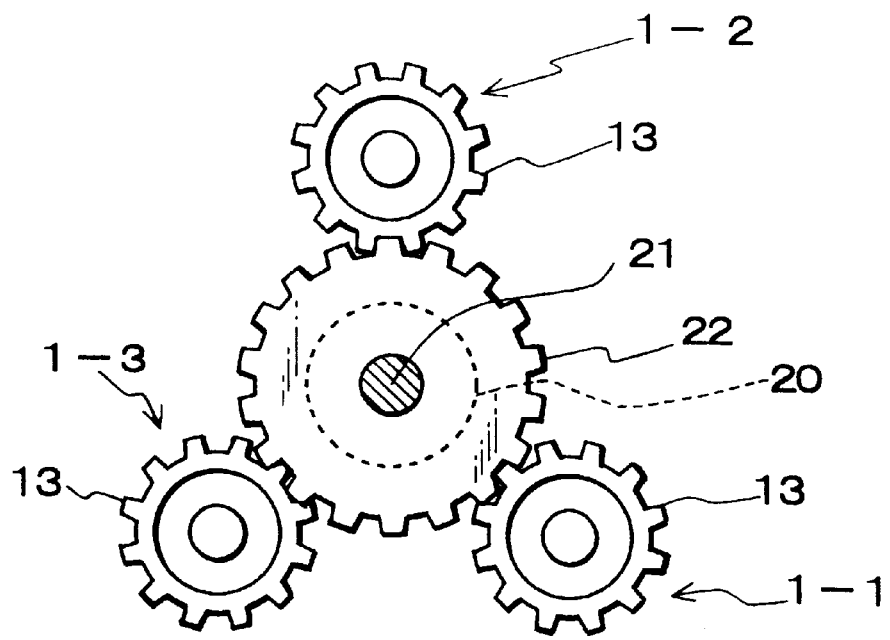
FIG. 5 is a plan view of the state of engagement of a gear of a chuck rotational mechanism and gears of a chuck member.

Such a chuck rotation mechanism 2 for driving the rotation of the three chuck members 1-1 to 1-3, as shown in FIG. 1 and FIG. 5, has a motor 20 and a gear 22 affixed to the upper end of the shaft 21 of the motor 20. The gear 22 is positioned at the center of gears 13 of the three chuck members 1-1 to 1-3 and engages with the three gears 13. Due to this, by driving the motor 20 to make the gear 22 rotate, the chuck members 1-1 to 1-3 rotate in the same direction at the same speed.

On the other hand, as shown in FIG. 1, the rod-shaped brushes 3-1 and 3-2 are arranged to face the radial direction of the magnetic disk W and are provided on their surfaces with a large number of bumps 30 as projections.

Figure 6:
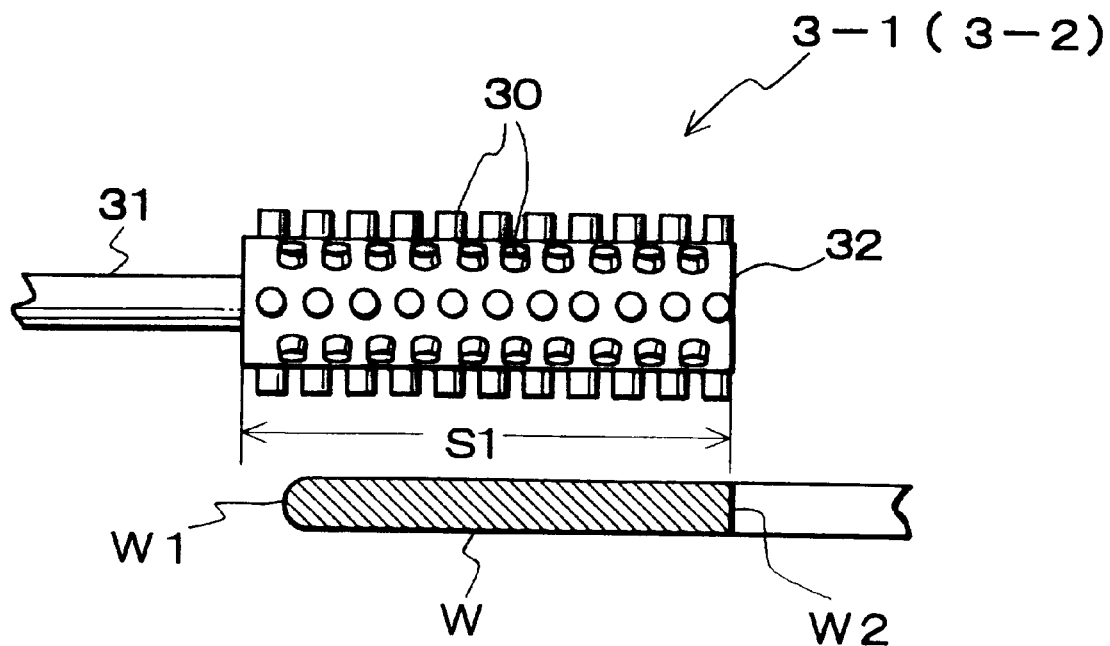
FIG. 6 is a side view of a rod-shaped brush.

FIG. 6 is a side view of the rod-shaped brush 3-1 (3-2).

The rod-shaped brush 3-1 (3-2) is constructed with a sponge 32 attached and affixed to the front end of a shaft 31. The length S1 of the sponge 32 is set to be longer than the distance between the outer circumference W1 and the inner circumference W2 of the magnetic disk W.

Further, the diameters and heights of the bumps 30 are set to 4 mm each. A large number of these bumps 30 are formed on the surface of the sponge 32 in a zig-zag pattern at 2 mm intervals.

The shafts 31 of the rod-shaped brushes 3-1 and 3-2 of this construction, as shown in FIG. 1, extend horizontally to the brush rotation mechanism 4 side. Their rear ends are rotatably attached to the front surface of the housing 4a of the brush rotation mechanism 4 through bearings 40.

Figure 7:
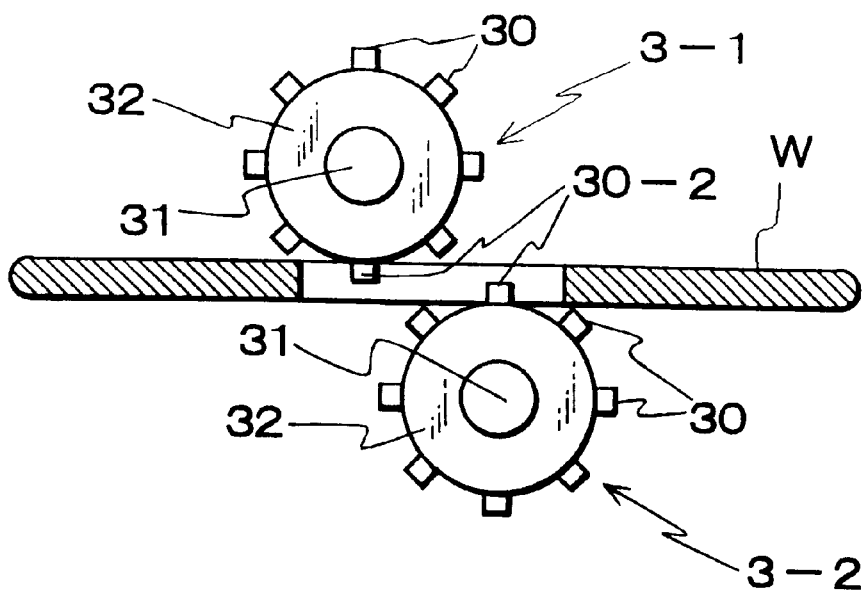
FIG. 7 is a front view of the state of arrangement of the rod-shaped brush.

Note that as shown in FIG. 7, seen from the front, the rod-shaped brush 3-2 is arranged so that its axis is off somewhat to the right of the axis of the rod-shaped brush 3-1. Due to this, the bumps 30-2, 30-2 of the front end sides of the sponges 32, 32 of the rod-shaped brushes 3-1 and 3-2 are kept from interfering with each other when the bumps 30-2, 30-2 enter into the center hole of the magnetic disk W. Therefore, the front end of the rod-shaped brush 3-2 projects out somewhat compared with the front end of the rod-shaped brush 3-1.

The brush rotation mechanism 4 has gears 41 and 42 affixed to the rear ends of the shafts 31 of the rod-shaped brushes 3-1 and 3-2 and a motor 43.

Specifically, a shaft of the motor 43 affixed to the bottom surface of the housing 4a is directly connected to the center of the gear 42. The gear 42 engages with the gear 41.

Due to this, by driving the motor 43, the rod-shaped brushes 3-1 and 3-2 rotate in opposite directions from each other along with the gears 41 and 42.

Further, the brush rotation mechanism 4 has a rocking portion 6 which makes the rod-shaped brushes 3-1 and 3-2 rock in the radial direction of the magnetic disk W to make the rear ends of the sponges 32 swing out to the outer circumference W1 side (see FIG. 6) of the magnetic disk W and make the front ends of the sponges 32 swing out to the inner circumference W2 side.

Figure 8:
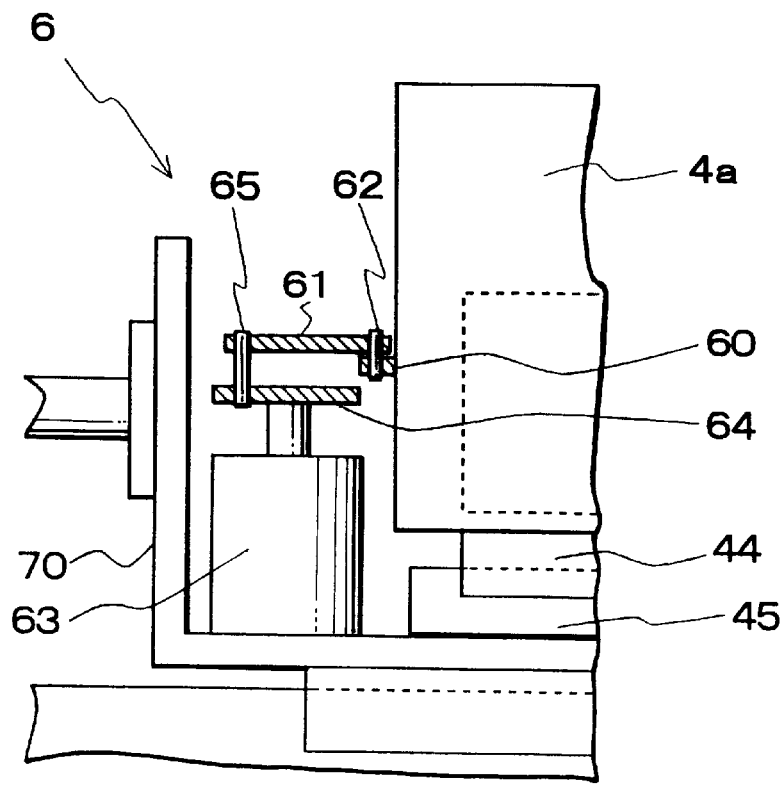
FIG. 8 is a partially cut away partial side view of the structure of a rocking portion.
Figure 9:
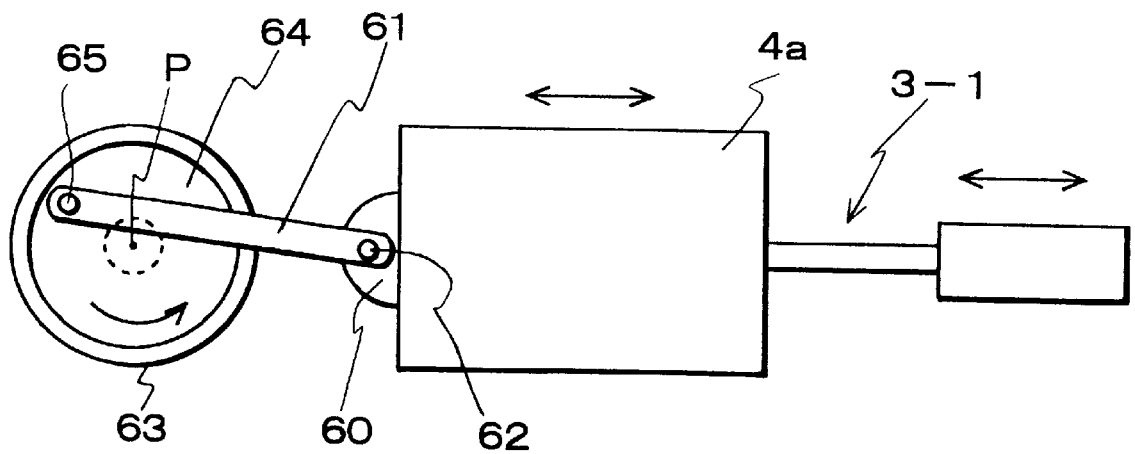
FIG. 9 is a plan view of the rocking portion.

FIG. 8 is a partially cut away partial side view of the structure of the rocking portion 6, while FIG. 9 is a plan view of the same.

As shown in FIG. 1, a slider 44 is attached to the bottom side of the housing 4a. The slider 44 engages with a rail 45 affixed on a platform 70 of an L-shape viewed from the side. The housing 4a is made able to move along the rail 45.

Further, as shown in FIG. 8 and FIG. 9, a bracket 60 is attached to the back surface of the housing 4a. The front end of a lever 61 is connected rotatably through a pin 62 to the bracket 60.

Further, the rear end of the lever 61 is connected rotatably to a circular plate 64 affixed to the shaft of a motor 63 affixed on the platform 70.

Specifically, the rear end of the lever 61 is connected to the circular plate 64 through a pin 65 at a position exactly 2 mm off from the center of rotation P of the circular plate 64.

Due to this, by driving the motor 63, the circular plate 64 rotates and the rear end of the lever 61 turns drawing a circle of a diameter of 4 mm. As a result, the housing 4a as a whole moves back and forth over a distance of 4 mm and the rod-shaped brushes 3-1 and 3-2 move rocking over a distance of 4 mm.

The platform 70 on which the brush rotation mechanism 4 is placed, as shown in FIG. 1, is designed to slide in an elevating housing 7a.

That is, a slider 71 is attached to the bottom side of the platform 70. The slider 71 is engaged with a rail 72 attached to the bottom surface of the elevating housing 7a. The front end of a piston rod 73 of a cylinder 7 affixed to the inside of the elevating housing 7a is connected to the rear surface portion of the platform 70.

Due to this, by making the piston rod 73 of the cylinder 7 extend and retract, brush rotation mechanism 4 slides along the rail 72 along with the platform 70 to enable the sponges 32 of the rod-shaped brushes 3-1 and 3-2 to contact with and detach from the upper and lower surfaces of the magnetic disk W.

The elevating housing 7a is supported by a jack 8. Sliders, not shown, are provided at the both side surfaces of the elevating housing 7a (surfaces of the front and rear sides in FIG. 1). These sliders engage with rails 80 provided at the side surfaces 10c (surfaces of front and rear sides in FIG. 1) of the apparatus housing 10.

Due to this, by using the jack 8 to elevate or lower the elevating housing 7a, it is possible to adjust the position of the rod-shaped brushes 3-1 and 3-2 in the vertical direction.

Note that the nozzles 5-1 and 5-2 are connected to a pump, not shown, through tubes 50. Pure water from the pump is sprayed onto the upper and lower surfaces of the magnetic disk W.

Next, an explanation will be given of an example of use of the cleaning apparatus of this embodiment.

In general, on the grinding or polishing line of workpieces, the workpieces are processed by a grinding or polishing step, cleaning step, and drying step, in that order.

Here, an explanation will be given of the case of use of the cleaning apparatus of this embodiment at the cleaning step of the above work line.

Figure 10:
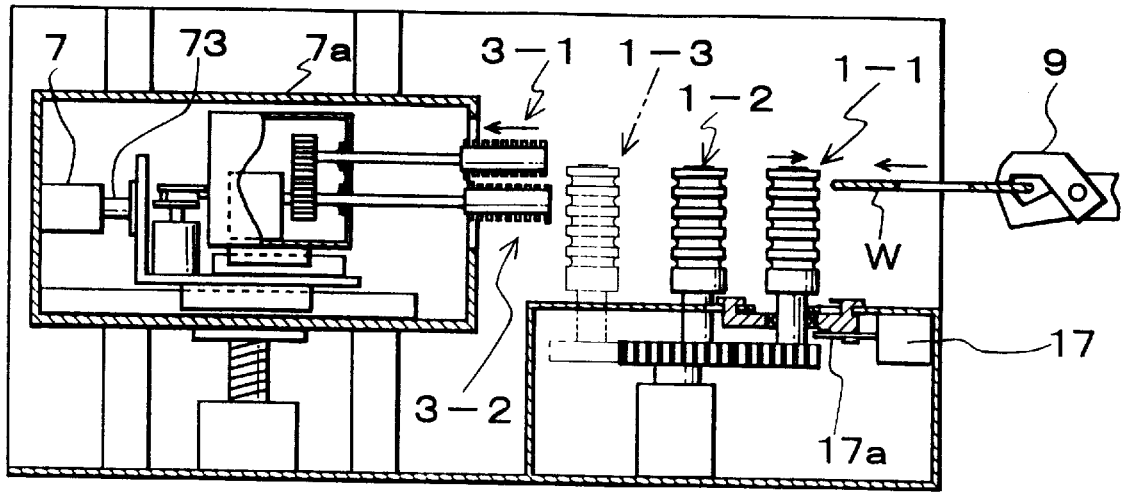
FIG. 10 is a sectional view of the state of detachment of the chuck members and rod-shaped brushes.

First, as shown in FIG. 10, the male screw 17a of the motor 17 is made to turn in reverse to make the chuck member 1-1 move away from the center axis L (see FIG. 3). The piston rod 73 of the cylinder 7 is retracted to pull the rod-shaped brushes 3-1 to 3-2 to the elevating housing 7a side.

Figure 11:
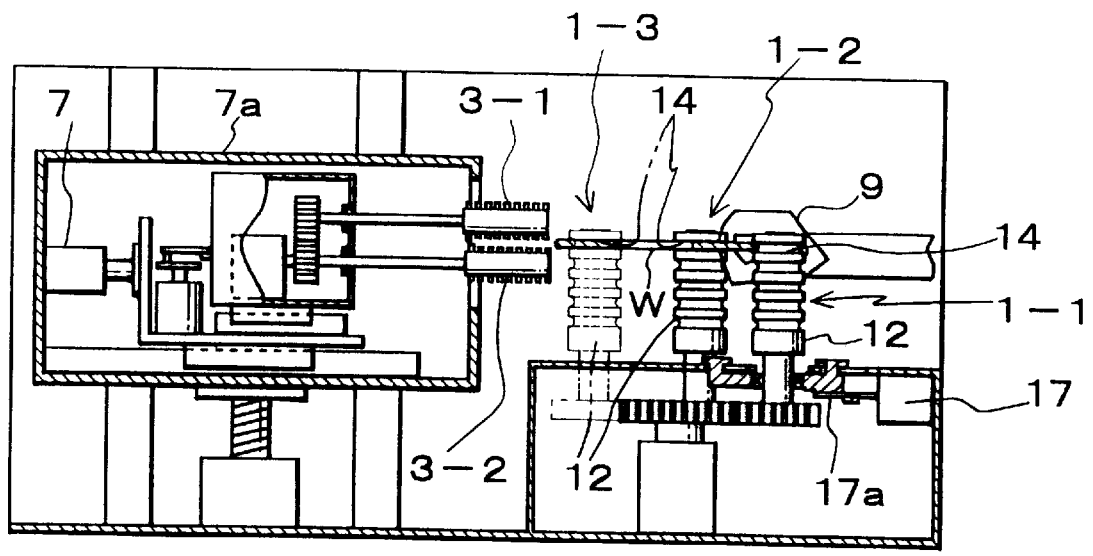
FIG. 11 is a sectional view of the state of a magnetic disk being gripped by the chuck members.

Next, as shown in FIG. 11, when a robot arm 9 carrying a polished magnetic disk W makes the outer periphery of the magnetic disk W engage with the topmost circumferential grooves 14 of the rollers 12 in the chuck members 1-2 and 1-3, the male screw 17a of the motor 17 is made to turn in the forward direction to bring the chuck member 1-1 close to the center axis L and make the topmost circular grooves 14 engage with the outer periphery of the magnetic disk W so as to support the magnetic disk W at three points by the three chuck members 1-1 to 1-3. At this time, the chuck member 1-1 is made to stop at a position where a slight pressing force is applied to the magnetic disk W.

Figure 12:
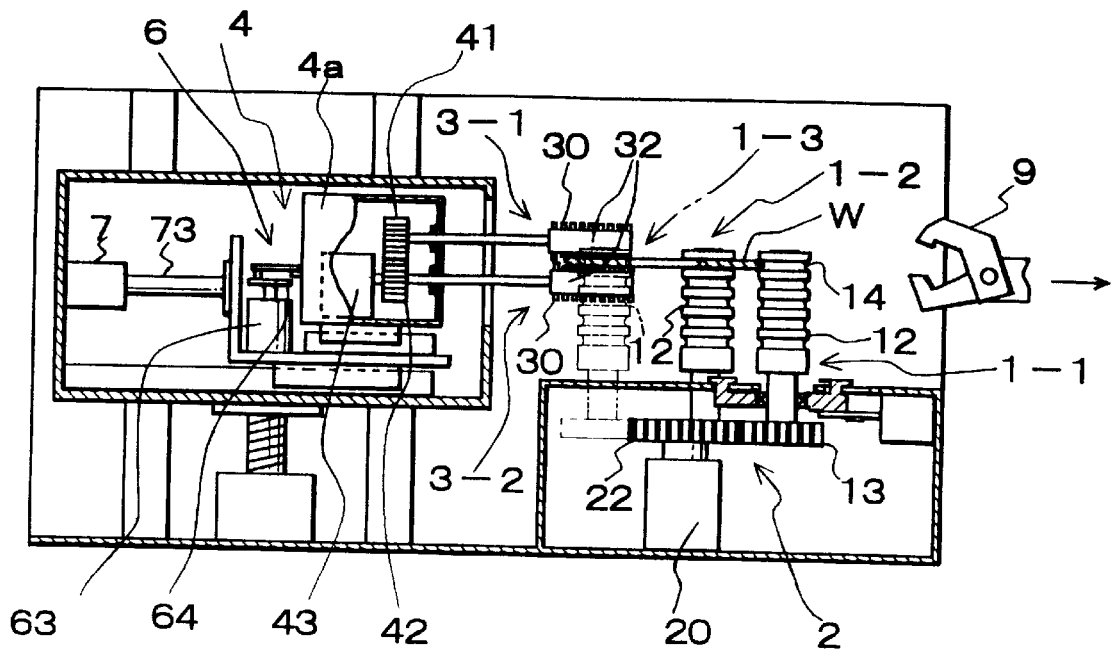
FIG. 12 is a sectional view of the state of cleaning of a magnetic disk.

Next, as shown in FIG. 12, when the robot arm 9 releases the magnetic disk W and is pulled away, the cylinder 7 is driven substantially simultaneously to extend the piston rod 73 and move the rod-shaped brushes 3-1 and 3-2 to the magnetic disk W side. This being done, the sponges 32 of the rod-shaped brushes 3-1 and 3-2 move in the direction of the center of the magnetic disk W while contacting the upper and lower surfaces of the magnetic disk W, so the cylinder 7 stops being driven when the sponges 32 of the rod-shaped brushes 3-1 and 3-2 contact the entire distance from the outer circumference W1 to the inner circumference W2 of the magnetic disk W.

In this state, the chuck members 1-1 to 1-3 and the rod-shaped brushes 3-1 and 3-2 are driven while pure water is sprayed on the upper and lower surfaces of the magnetic disk W from the nozzles 5-1 and 5-2 (see FIG. 1).

That is, the motor 20 of the chuck rotation mechanism 2 is driven to make the chuck members 1-1 to 1-3 rotate at the same speed, the motor 43 of the brush rotation mechanism 4 is driven to make the rod-shaped brushes 3-1 and 3-2 rotate in opposite directions from each other, and the motor 63 is driven to make the rod-shaped brushes 3-1 and 3-2 rock back and forth in the radial direction of the magnetic disk W so as to clean the upper and lower surfaces of the magnetic disk W.

Here, a more detailed explanation will be given of the operation of the chuck members 1-1 to 1-3 and the rod-shaped brushes 3-1 and 3-2 at the time of cleaning.

When the motor 20 is driven, the three gears 13 engaged with the gear 22 rotate in the same direction and the rollers 12 rotate in the same direction at the same speed.

At this time, the magnetic disk W is gripped by the circumferential grooves 14 of the rollers 12 of the chuck members 1-1 to 1-3. Further, the rollers 12 are formed by polyurethane foam having a high frictional coefficient. Accordingly, the rotation of the rollers 12 is reliably transmitted to the magnetic disk W. Therefore, the rollers 12 will not spin on their own with the outer periphery of the magnetic disk W slipping in the circumferential grooves 14. As a result, by setting the rotational speed of the chuck members 1-1 to 1-3 to for example 300 rpm, the magnetic disk W will rotate at a high speed of 100 rpm.

On the other hand, at the rod-shaped brushes 3-1 and 3-2, when the motor 43 of the brush rotation mechanism 4 is driven, the gears 42 connected to the shaft of the motor 43 turn and the gears 41 engaged with the gears 42 rotate. As a result, the sponges 32 of the rod-shaped brushes 3-1 and 3-2 rotate in opposite directions to each other while in contact with the upper and lower surfaces of the magnetic disk W.

Figure 13:
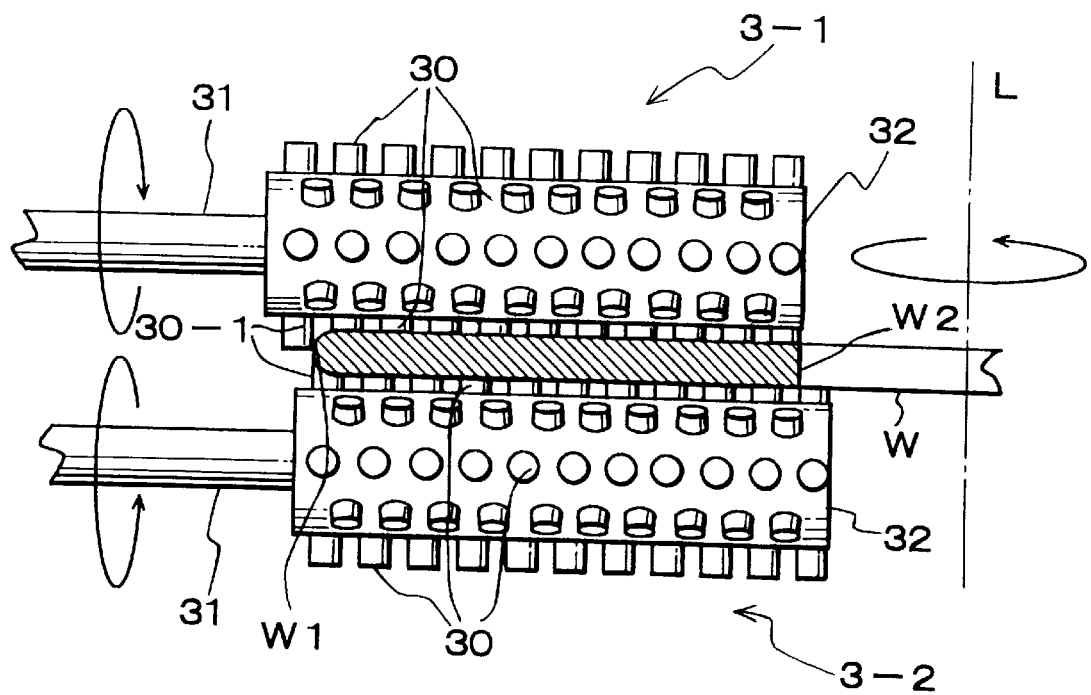
FIG. 13 is a side view of the state of contact of bumps of the rod-shaped brush and a magnetic disk.

Specifically, as shown in FIG. 13, the majority of the bumps 30-1 of the sponges 32 of the rod-shaped brushes 3-1 and 3-2 elastically contract the upper and lower surfaces of the magnetic disk W, while the bumps 30 at the rear ends of the sponges 32 contact the outer circumference W1 of the magnetic disk W.

Accordingly, as shown by the arrows in FIG. 13, when the sponges 32 of the rod-shaped brushes 3-1 and 3-2 with outer diameters set to ¼ of the diameter R of the magnetic disk W are made to rotate at a speed of for example 1200 rpm in a direction of feeding the magnetic disk W forward, the relative speed of the bumps 30 with respect to the magnetic disk W becomes at least the speed shown by the following equation (1):

$$1200 \times 2 \pi R/4 - 100 \times 2 \pi R = 200 \times 2 \pi R \qquad (1)$$

That is, the majority of the bumps 30 of the sponges 32 contact the magnetic disk W at a component of velocity of at least $200 \times 2 \pi R$ and clean the upper and lower surfaces of the magnetic disk W.

In parallel with this operation, when the motor 63 of the rocking portion 6 shown in FIG. 12 is driven, the circular plate 64 rotates and the housing 4a as a whole moves back and forth over a distance of 4 mm in 2 seconds so the sponges 32 of the rod-shaped brushes 3-1 and 3-2 rock back and forth over 4 mm in 2 seconds.

At this time, since the diameter of the bumps 30 of the sponges 32 is set to 4 mm, the outer circumference W1 and the inner circumference W2 of the magnetic disk W are cleaned by the bumps 30 of the rod-shaped brushes 3-1 and 3-2.

Figure 14:
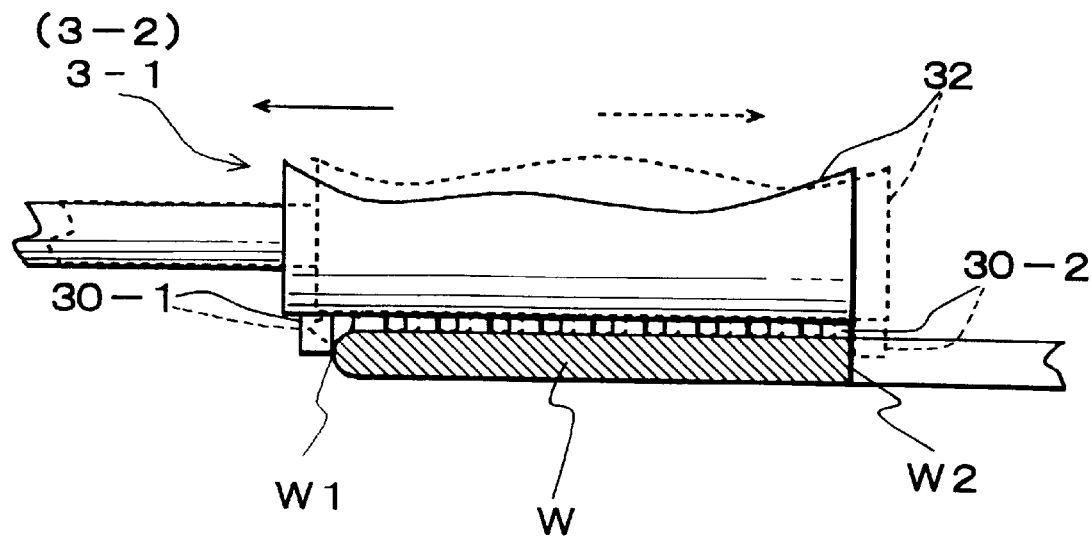
FIG. 14 is a schematic side view of the cleaning operation of the outer circumference and inner circumference of the magnetic disk by the bumps.

FIG. 14 is a schematic side view of the cleaning operation of the outer circumference W1 and inner circumference W2 by the bumps 30.

Before the sponge 32 of the rod-shaped brush 3-1 (3-2) starts rocking, as shown by the solid line in FIG. 14, the bump 30-1 at the rear end side of the sponge 32 contacts the outer circumference W1 of the magnetic disk W. In this state, if the sponge 32 is made to move 4 mm in the radial direction of the magnetic disk W, as shown by the broken lines in FIG. 14, the bump 30-1 moves in the direction of the upper and lower surfaces of the magnetic disk W while in contact with the outer circumference W1. At the same time, the bump 30-2 of the front end side of the sponge 32 enters into the center hole of the magnetic disk W while in contact with the inner circumference W2. When the sponge 32 is pulled back by exactly 4 mm, the bump 30-1 and the bump 30-2 return to the positions shown by the solid lines while in contact with the outer circumference W1 and the inner circumference W2. In this way, the outer circumference W1 and the inner circumference W2 of the magnetic disk W are reliably cleaned by the bumps 30-1 and 30-2.

If the sponge 32 is rocked back and forth in this way, however, the abrasive etc. entering between the bumps 30 and the surfaces of the magnetic disk W may cause scratches in the radial direction of the surfaces of the magnetic disk W.

In this embodiment, however, the sponges 32 rotating at the high speed are made to rock back and forth at a low speed, so no scratches are formed in the radial direction of the magnetic disk W.

That is, assuming that the outer diameter of the magnetic disk W is 3.5 inches (about 90 mm), from the above equation (1), the relative component of velocity of the bumps 30 in the circumferential direction is at least about 113040 mm. As opposed to this, since the speed of movement of the bumps 30 in the radial direction is 4 mm per second, the component of velocity is 240 mm and the component of velocity of the bumps 30 in the circumferential direction becomes more than as much as 471 times the component of velocity in the radial direction. Therefore, the scratches caused by abrasive etc. entering between the bumps 30 and the magnetic disk W draw paths along the circumference of the magnetic disk W.

After the upper and lower surfaces and the outer circumference W1 and inner circumference W2 of the magnetic disk W are cleaned for a predetermined time in this way, the motor 20 of the chuck rotation mechanism 2, the motor 43 of the brush rotation mechanism 4, and the motor 63 of the rocking portion 6 are made to stop, the cylinder 7 is used to pull the rod-shaped brushes 3-1 and 3-2 to the elevating housing 7a side as shown in. FIG. 11, and the robot arm 9 for carrying the magnetic disk W to the drying step grips the magnetic disk W. At this time, as shown in FIG. 10, the male screw 17a of the motor 17 is made to turn in reverse to move the chuck member 1-1 away from the center axis L.

Next, the uncleaned magnetic disks W successively carried from the polishing step by the robot arm 9 are cleaned in the same way as above.

Since the circumferential grooves 14 of the chuck members 1-1 to 1-3 grip the magnetic disk W and make the magnetic disk W rotate at a high speed, there is a problem with the abrasion of the circumferential grooves 14. However, since the rollers 12 are formed by polyurethane foam with a high abrasion resistance, the circumferential grooves 14 will not abrade in a short time.

Figure 15:
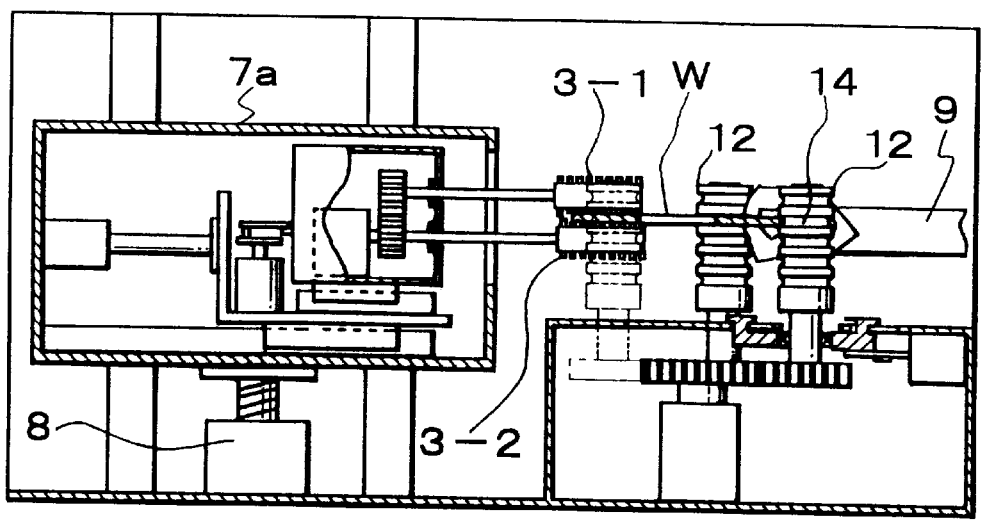
FIG. 15 is a sectional view of the state of cleaning at new circumferential grooves.
Figure 16:
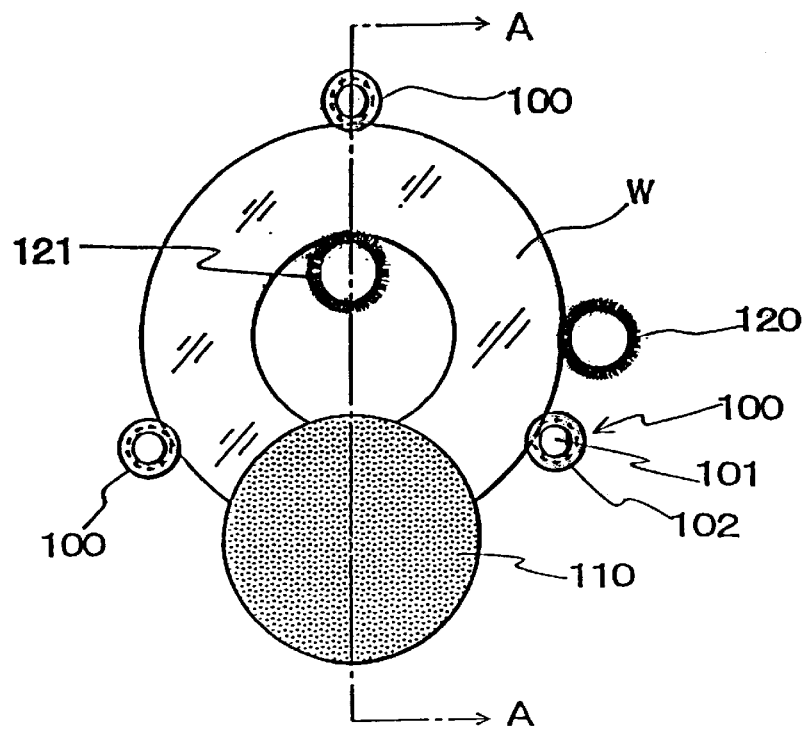
FIG. 16 is a plan view of an example of a cleaning apparatus of the prior art.
Figure 17:
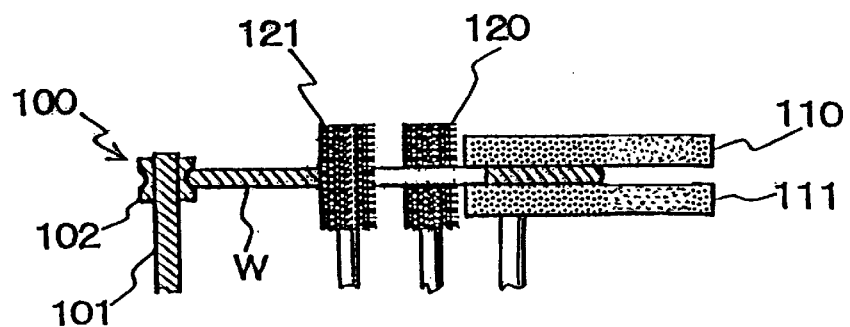
FIG. 17 is a sectional view along the line A—A of FIG. 16.
Figure 18:
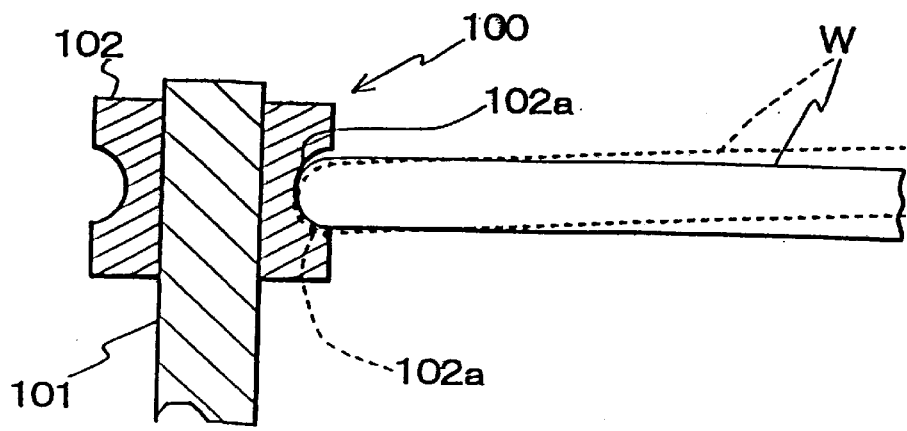
FIG. 18 is a sectional view of the state of abrasion of the groove of a roller.
Figure 19:
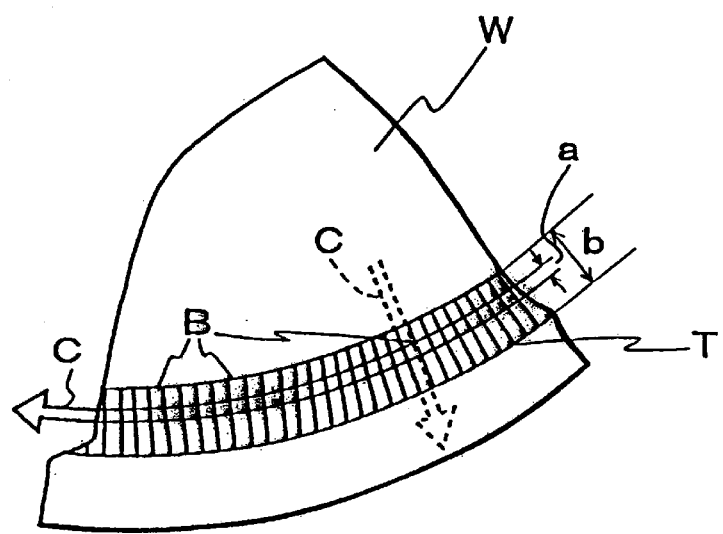
FIG. 19 is a plan view of bit area of a track and the direction of formation of scratches.

Further, when the topmost circumferential grooves 14 have been used for a long time and as a result the circumferential grooves abrade and might obstruct rotation of the magnetic disk W, as shown in FIG. 15, the robot arm 9 is set to make the magnetic workpiece W engage with the next circumferential grooves 14 and the jack 8 is used to lower the elevating housing 7a as a whole to position the rod-shaped brushes 3-1 and 3-2 so as therefore to enable continuous normal high speed rotational drive and cleaning of the magnetic disk W.

In this way, according to the cleaning apparatus of this embodiment, since it is possible to make the magnetic disk W rotate at a high speed, it is possible to reduce the cleaning time by that amount and possible to improve the efficiency of the cleaning work.

Further, since the rollers 12 of the chuck members 1-1 to 1-3 are formed by polyurethane foam, there is extremely little abrasion of the circumferential grooves 14 and as a result it is possible to reduce the frequency of replacement of the chuck members 1-1 to 1-3 and possible to improve the operating efficiency of the cleaning apparatus. Further, since five circumferential grooves 14 are formed in the rollers 12 and can be successively used, it is possible to extend the lifetime of the rollers 12 five-fold and possible to strikingly improve the operating rate of the cleaning apparatus.

Further, since it is possible to clean the outer circumference W1 and the inner circumference W2 of the magnetic disk W by the rocking action of the rod-shaped brushes 3-1 and 3-2, there is no need to specially provide a mechanism exclusively for cleaning the outer circumference W1 and the inner circumference W2 and it is possible to reduce the size and cost of the apparatus by that amount.

Further, since scratches caused at the time of cleaning are formed in the circumferential direction of the magnetic disk W, it is possible to provide a high quality magnetic disk W with no bit errors etc.

Note that the present invention is not limited to the above embodiment and includes various modifications and changes within the scope of the invention.

For example, in the above embodiment, the explanation was made of the case of cleaning a magnetic disk W, but a wafer or other workpiece can also be cleaned similarly efficiently.

Further, while the embodiment was configured to drive all of the three chuck members 1-1 to 1-3 to rotate, it is also possible to drive the rotation of just one or two chuck members and allow the remaining chuck members or member to rotate following them.

Further, while the rollers 12 of the chuck members 1-1 to 1-3 were formed by polyurethane foam in this embodiment, the rollers 12 need only be formed by a material having a high abrasion resistance and high frictional coefficient, and the material is not limited.

Further, in the above embodiment, the rod-shaped brushes 3-1 and 3-2 were set to rotate in a direction feeding the magnetic disk W, but the rod-shaped brushes 3-1 and 3-2 may also be set to rotate in the opposite direction. It is sufficient that the difference between the rotational speed of the rod-shaped brushes 3-1 and 3-2 and the rotational speed of the magnetic disk W not be zero. The directions of rotation may be any directions.

Further, while the embodiment was configured with the sponges 32 of the rod-shaped brushes 3-1 and 3-2 made to rock back and forth over a distance of exactly 4 mm, they may be made to rock back and forth over a distance of for example of 6 or made to rock back and forth otherwise so that the bumps 30 swing out from the outer periphery and inner periphery of the magnetic workpiece W.

Further, in the above embodiment, members comprised of the sponges 32 provided with bumps 30 attached to shafts 31 were used as the rod-shaped brushes, but it is also possible to use a flocked brush attached to the front end of shafts 31.

As explained above in detail, according to the invention, there is the effect that it is possible to improve the efficiency of the cleaning work since it is possible to make the workpiece rotate at a high speed by raising the rotational speed of the chuck members by the chuck rotation mechanism.

Further, since the abrasion of the chuck members is extremely small, there is no longer any tilting and cessation of rotation of the workpiece due to abrasion of the circumferential grooves of the chuck member in a short time as in the cleaning apparatus of the related art and therefore suitable rotation of the workpiece can be sustained over a long period. As a result, there is less frequent replacement of the chuck members and it is possible to improve the operating rate of the cleaning apparatus.

Further, since there are no scratches formed in the radial direction of the workpiece, it is possible to provide a high density magnetic disk or other workpiece of a high quality free of bit errors.

Further, according to the invention, there is the effect that since it is possible to make the workpiece suitably rotate using another circumferential groove without replacing a chuck member even if one circumferential groove abrades, the lifetime of the chuck member becomes longer in proportion to the number of the circumferential grooves and the operating rate of the cleaning apparatus can be strikingly improved by that amount.

Further, according to the invention, not only is it possible to avoid formation of scratches in the radial direction of the surface of the workpiece, but it also becomes possible to reliably clean the surface by the projections or flocked brushes.

Further, according to the invention, not only is it possible to clean the surfaces of the workpiece, but it is also possible to clean at least the outer circumference of the workpiece by part of the rod-shaped brush, so there is no need for a special mechanism for cleaning the outer circumference of the workpiece such as in the cleaning apparatus of the related art and as a result it is possible to reduce the size and cost of the apparatus.

Further, according to the invention, not only is it possible to clean at least the outer circumference of the workpiece by the rod-shaped brush, it is also possible to substantially completely avoid formation of scratches in the radial direction.

Further, according to the invention, it is possible to clean the inner circumference and the outer circumference by the rod-shaped brush even in a donut-shaped workpiece like a magnetic disk.

While the invention has been described by reference to specific embodiments chosen for purposes of illustration, it should be apparent that numerous modifications could be made thereto by those skilled in the art without departing from the basic concept and scope of the invention.

What is claimed is:

1. A cleaning apparatus comprising:
    at least three chuck members for chucking the periphery of a disk shaped workpiece;
    a chuck rotation mechanism for making at least one of said chuck members rotate;
    a rod shaped brush arranged in a state in contact with a surface of the workpiece so as to face a radial direction of the workpiece; and
    a brush rotation mechanism for making said rod shaped brush rotate about a shaft thereof;
    wherein said chuck members are formed of a material having a high abrasion resistance and a high frictional coefficient and the surface of said chuck members is formed with circumferential grooves for engagement with the periphery of the workpiece.

2. A cleaning apparatus as set forth in claim 1, wherein a plurality of circumferential grooves are provided in longitudinal directions of said chuck members.

3. A cleaning apparatus as set forth in claim 1, wherein said chuck members are formed from polyurethane foam.

4. A cleaning apparatus as set forth in claim 1, wherein said chuck rotation mechanism makes all of the chuck members rotate.

5. A cleaning apparatus as set forth in claim 1, wherein said rod-shaped brush has a plurality of projections on its surface formed by an elastic material.

6. A cleaning apparatus as set forth in claim 1, wherein said rod-shaped brush is a flocked brush.

7. A cleaning apparatus as set forth in claim 1, wherein said brush rotation mechanism makes the rod-shaped brush rotate about a shaft thereof and makes said rod-shaped brush rock back and forth so that part of said rod-shaped brush swings out to at least the outer circumference side of the workpiece.

8. A cleaning apparatus as set forth in claim 7, wherein the speed of rocking of said rod-shaped brush is set to be slower than the rotational speed of the workpiece so that the point of contact of said rod-shaped brush with respect to the workpiece draws a path in the substantially circumferential direction of the workpiece.

9. A cleaning apparatus as set forth in claim 7, wherein the workpiece is a donut shaped disk and said brush rotation mechanism makes said rod-shaped brush rock back and forth so that a rear end of said rod-shaped brush swings out to the outer circumference side of the workpiece and so that a front end of said rod-shaped brush swings out to the inner circumference side of the workpiece.

* * * * *